(12) United States Patent
Nazemi (10) Patent No.: US 7,808,417 B2
(45) Date of Patent: *Oct. 5, 2010

(54) ANALOG-TO-DIGITAL CONVERTER

(75) Inventor: Ali Nazemi, Lake Forest, CA (US)

(73) Assignee: ClariPhy Communications, Inc., Irvine, CA (US)

( * ) Notice: Subject to any disclaimer, the term of this patent is extended or adjusted under 35 U.S.C. 154(b) by 67 days.

This patent is subject to a terminal disclaimer.

(21) Appl. No.: 12/283,788

(22) Filed: Sep. 15, 2008

(65) Prior Publication Data

US 2009/0096647 A1 Apr. 16, 2009

Related U.S. Application Data

(60) Provisional application No. 60/972,372, filed on Sep. 14, 2007.

(51) Int. Cl.
*H03M 1/38* (2006.01)

(52) U.S. Cl. .................. 341/161; 341/118; 341/120; 341/155

(58) Field of Classification Search ........... 341/118, 341/119, 120, 156, 161, 155
See application file for complete search history.

(56) References Cited

U.S. PATENT DOCUMENTS

| | | | |
|---|---|---|---|
| 5,239,299 A | 8/1993 | Apple et al. | |
| 5,696,511 A | 12/1997 | Matsumoto et al. | |
| 6,369,744 B1 | 4/2002 | Chuang | |
| 6,377,195 B1 | 4/2002 | Eklund et al. | |
| 6,384,757 B1 | 5/2002 | Kosonen | |
| 6,473,013 B1 | 10/2002 | Velazquez et al. | |
| 6,489,904 B1 | 12/2002 | Hisano | |
| 6,606,042 B2 | 8/2003 | Sonkusale et al. | |
| 6,642,871 B2 | 11/2003 | Takeyabu et al. | |
| 6,861,969 B1 | 3/2005 | Ali | |
| 6,904,110 B2 | 6/2005 | Trans et al. | |
| 6,909,391 B2 | 6/2005 | Rossi | |
| 7,576,676 B2 | 8/2009 | Grace | |
| 2002/0012152 A1 | 1/2002 | Agazzi et al. | |
| 2002/0113726 A1 | 8/2002 | Nagaraj | |
| 2003/0184466 A1 | 10/2003 | Takeyabu et al. | |
| 2004/0086275 A1 | 5/2004 | Lenosky et al. | |
| 2004/0160351 A1 | 8/2004 | Rossi | |
| 2005/0068221 A1 | 3/2005 | Freeman et al. | |
| 2005/0152479 A1 | 7/2005 | Bulow et al. | |
| 2005/0219091 A1 | 10/2005 | Wood et al. | |
| 2006/0066466 A1 | 3/2006 | Pan et al. | |
| 2006/0279445 A1 | 12/2006 | Kinyua et al. | |

(Continued)

OTHER PUBLICATIONS

PCT International Search Report and Written Opinion, PCT/US06/44679, Mar. 21, 2008, 11 pages.

(Continued)

*Primary Examiner*—Jean B Jeanglaude
(74) *Attorney, Agent, or Firm*—Fenwick & West LLP (57) ABSTRACT

A lookahead pipelined ADC architecture uses open-loop residue amplifiers with calibration. This approach is able to achieve a high-speed, high-accuracy ADC with reduced power consumption. In one aspect, an ADC pipeline unit includes a plurality of lookahead pipeline stages (i.e., an ADC lookahead pipeline) coupled to a calibration unit. The ADC lookahead pipeline uses open-loop residue amplifiers. The calibration unit compensates for non-linearity in the open-loop amplifiers.

15 Claims, 7 Drawing Sheets

U.S. PATENT DOCUMENTS

2008/0240325 A1* 10/2008 Agazzi et al. ............... 375/371
2009/0243907 A1   10/2009 Nazemi et al.

OTHER PUBLICATIONS

PCT International Search Report and Written Opinion, PCT/US06/38690, Nov. 5, 2007, 10 pages.

Chang, Dong-Young, et al., Sub 1-V Design Techniques for High-Linearity Multistage/Pipelined Analog-to-Digital Converters, IEEE Transactions on Circuits and Systems—I: Regular Papers, vol. 52, No. 1, Jan. 2005, pp. 1-12.

Grace, C., "Digital Calibration of Interstage Gain Errors and Signal-Dependent Variations in Pipelined Analog-to-Digital Converters," Dissertation for University of California Davis, 2004, 156 Pages.

\* cited by examiner

ANALOG-TO-DIGITAL CONVERTER

CROSS-REFERENCE TO RELATED APPLICATION

This application claims priority under 35 U.S.C. §119(e) to U.S. Provisional Patent Application Ser. No. 60/972,372, "10.3 GS/s 6 bit Interleaved/Pipelined ADC Using Open-Loop Amplifiers and Digital Calibration for a Maximum—Likelihood Sequence Detection Receiver in 90 nm CMOS," by Ali Nazemi et. al, filed Sep. 14, 2007. The subject matter of the foregoing is incorporated herein by reference in its entirety.

BACKGROUND OF THE INVENTION

1. Field of the Invention

This invention relates generally to analog-to-digital converters. More particularly, it relates to high speed analog-to-digital converters using lookahead pipelined architecture and open-loop residue amplifiers.

2. Description of the Related Art

There is a need for high speed analog-to-digital converters (ADCs). For example, there is strong commercial interest in 10 Gbit/s serial data transmission. In order to enable high performance sampling detectors, such as the Viterbi detector, a higher receive SNR is required than is required for suboptimal detectors such as decision feedback equalization. In order to provide these higher SNRs, 10 Gigasamples per second (GS/s) ADCs with 5-8 bits of accuracy are currently required.

However, power dissipation is a significant problem for higher speed ADCs. In fact, all previously reported multi-GHz ADCs use too much power to be considered viable for 10 Gbit/s serial data transmission applications. A useful figure of merit in evaluating the power efficiency of an ADC is the quantization energy $E_Q$, expressed in picojoules per conversion step:

$$E_Q = \frac{\text{Power}}{2^{ENOB}(2F_{BW})} \quad (1)$$

where Power is the power consumption in watts, ENOB is the effective number of bits of the ADC, and $F_{BW}$ is the full-speed bandwidth of the converter (equal to Fs/2 in a full Nyquist ADC). The presently reported state of the art for very high speed ADCs is 1.6 GS/s conversion rate but with quantization energy of 7.4 pJ/conv-step. A more power efficient ADC is reported at only 1.0 pJ/conv-step but it only has a conversion rate of 80 MS/s.

A goal of current ADCs is a conversion rate of 10 GS/s with a resolution of 5 bits per sample and a quantization energy of 0.3 pJ/conv-step. This goal is important in order to reduce overall system power to a point where 10 Gbit/s data transmission using the Viterbi detector would be commercially viable using current technology.

Two common architectures for high speed ADCs are flash and pipeline. The flash ADC is the simplest and inherently fastest ADC. It uses $2^N-1$ parallel comparators, where N is the number of bits. The incoming analog value is simultaneously applied to each of the comparators, with the aggregate results from all of the comparisons determining the digital representation. Besides complexity and power consumption that grows geometrically with resolution, high-resolution flash converters have tight offset requirements that further increase power consumption.

The pipelined ADC uses simpler, lower resolution ADC stages which work concurrently on different samples of the input, so the throughput is equal to the speed of a given stage and is almost independent of the number of stages. The power consumption of a pipeline grows linearly with the number of bits, and offset requirements are reduced in the low resolution ADC stages when redundancy is applied. However, the ADC stages typically include linear residue amplifiers, which traditionally are implemented as operational amplifiers connected in a negative feedback configuration. The use of a closed feedback loop increases the power consumption.

Thus, there is a need for high speed ADCs that can achieve both high speed and high accuracy while simultaneously achieving low power consumption.

SUMMARY OF THE INVENTION

The present invention overcomes the limitations of the prior art by providing a lookahead pipelined ADC architecture that uses open-loop residue amplifiers with calibration. This approach is able to achieve a high-speed, high-accuracy ADC with reduced power consumption.

In one aspect, an ADC pipeline unit includes a plurality of lookahead pipeline stages (i.e., an ADC lookahead pipeline) coupled to a calibration unit. The ADC lookahead pipeline includes open-loop residue amplifiers, which results in faster and/or lower power operation. The lookahead architecture allows other circuitry to keep pace with the open-loop amplifiers. The calibration unit compensates for non-linearity in the open-loop amplifiers. Furthermore, assume that the ADC pipeline unit performs an N-bit digital conversion. The ADC pipeline generates M raw bits, with M>N, thus adding redundancy to compensate for the lower accuracy open-loop amplifiers.

One advantage of using open-loop residue amplifiers is that they can increase the sampling rate possible at a given power consumption by removing the requirement for linear amplifiers. In an ADC pipeline unit with open-loop residue amplifiers, the comparators in the sub-ADCs consume significant power relative to the residue amplifiers. This is in contrast to a conventional ADC pipeline in which the overall stage power consumption is typically dominated by the power consumption of the operational amplifier. To reduce comparator power and to reduce the risk of comparator metastability (which is important to achieve a low bit-error rate), the lookahead architecture is used in order to give the comparator more time to regenerate. To achieve higher accuracy than is possible based solely on component manufacturing tolerances, non-linear calibration is used to desensitize the ADC pipeline from errors in the gain and offset values of the open-loop residue amplifiers.

In one aspect, the ADC pipeline unit includes M lookahead pipeline stages for an N-bit ADC with M>N and each lookahead pipeline stage generates 1 raw bit. In other words, the ADC pipeline unit uses a sub-radix architecture.

In another aspect, various techniques are used to improve performance and/or manufacturability. For example, resistor and comparator trimming circuits can be used to compensate for process variations. Circuits that reduce charge sharing between sample and hold capacitors and the inputs to open loop amplifiers can increase the gain bandwidth product. Variable duty cycle can be used to adjust how much time is allocated to various phases of comparator operation, thus increasing performance.

In another aspect of the invention, pipeline units as described above are multiplexed to produce an interleaved ADC. The interleaved ADC includes an analog demultiplexer, K ADC channels and a digital multiplexer. For example, an incoming 10 GS/s analog stream can be demultiplexed into eight 1.25 GS/s analog streams (K=8). Each ADC channel converts one of these analog streams into a corresponding digital streams, which are then multiplexed together to form the final digital output stream. In one design, each ADC channel includes two ADC pipeline units. One unit is in operation while the other is in calibration. The two pipeline units automatically interchange roles of operation and calibration.

Other aspects of the invention include systems using the devices described above, and methods corresponding to and applications for these devices and systems.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION OF THE PREFERRED EMBODIMENTS

Throughout the following description, a 10.3 GS/s 6 bit ADC with an input bandwidth of 5.1 GHz will be used to illustrate various aspects of the invention. To increase resolution with moderate power dissipation, this example circuit uses a pipelined architecture with open-loop amplifiers and digital calibration. Various trimming circuits are used to enhance yield over process. A 1 bit per stage approach increases the gain-bandwidth product for a given power consumption. To achieve a bit error rate (BER)<$10^{-12}$ required by the example application (90 nm CMOS MLSD MMF transceiver), each comparator utilizes a probability of a metastable event significantly lower than $10^{-12}$, resulting in a comparator maximum clock rate of 1.5 GHz. An 8 way interleaved ADC design is used, comprising 8 ADC channels clocked at 1.3 GHz. Each ADC channel includes two ADC pipelines, allowing continuous background calibration. The input of each pair is selected through an analog multiplexer. In a conventional 1 bit per stage architecture, the comparator is allowed to make a decision within half a clock cycle. By contrast, this examples uses a bit look-ahead scheme shown in FIG. 1 to increase the comparator regeneration time. Simulations show that 10 pipelined stages can achieve 6 ENOB after calibration.

Figure 1:
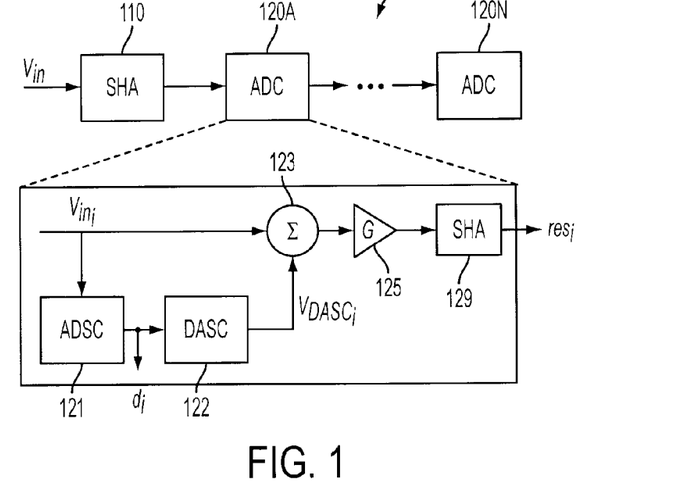
FIG. 1 is a block diagram illustrating a pipelined ADC architecture, suitable for use with the present invention.

FIG. 1 is a block diagram illustrating a pipelined ADC architecture suitable for use with the present invention. The ADC pipeline 100 includes an input sample-and-hold stage 110 followed by a number of low resolution ADC stages 120A-120N. The stages 120 preferably are identical, except that the beginning and ending stages may be different due to their location at the beginning or end of the pipeline 100. In this example, each ADC stage 120 is a 1-bit stage. Each stage 120 includes a 1-bit analog-to-digital converter (e.g., a comparator) 121, a 1-bit digital-to-analog converter 122 (e.g., a switch), an analog subtractor 123, a gain stage (i.e., the residue amplifier) 125, and a sample-and-hold circuit 129. The 1-bit ADC 121, which will also be referred to as a sub-ADC, makes a 1-bit decision on the input signal $V_{ini}$ for the stage 120. This bit $d_i$ is used in the sub-DAC 122 to generate a voltage $V_{DASCi}$ representing the contribution of that bit $d_i$ to the input signal $V_{ini}$. The subtractor 123 subtracts the contribution $V_{DASCi}$ from the input signal $V_{ini}$ to develop a residue, which is the remaining value of the input signal after the value of the previously decided bits is removed. The residue amplifier 125 multiplies the residue by a gain value G (which is 2 if the stage converts one effective bit). The resulting residue $res_i$ is held in a sample-and-hold circuit 129 and used as the input signal $V_{ini}$ for the next stage. Thus, each stage is operating to produce 1 bit of the result. The gain of 2 applied by the residue amplifier 125 scales the residue so that the same circuitry can be used for the next stage. The speed of this converter is limited by the critical path consisting of the 1-bit ADC (typically a comparator) 121, the 1-bit DAC (which is typically just a switch) 122, the subtractor 123, and the residue amplifier 125.

Unlike conventional ADC pipelines, the residue amplifiers 125 according to the invention are implemented as open-loop amplifiers. In a conventional ADC pipelines, the residue amplifiers 125 are closed-loop amplifiers. Closed-loop amplifiers can be more closely controlled, in terms of parameters such as gain and nonlinearity. However, closed-loop amplifiers have more severe speed limitations or require more power to achieve a given speed than open-loop amplifiers. The use of open-loop amplifiers provides higher speed (increases swing and bandwidth) with lower power. It can also reduce requirements on transistor performance.

However, because the gain G provided by open-loop amplifiers 125 can be less controlled, some form of redundancy is preferably employed to avoid the loss of analog information in the pipeline. In one approach, a sub-radix architecture with redundancy is used. In a non-redundant architecture, the total number of raw bits $d_i$ generated by the stages 120 is the same as the number of bits in the digital representation. In a redundant architecture, the stages 120 produce more raw bits $d_i$ than the number of output bits in the digital representation. The extra bits represent redundant information which is used to correct errors in the pipeline. In a sub-radix architecture, each stage 120 outputs one raw bit $d_i$ but effectively converts less than one output bit of the digital representation. Therefore, the total number of stages 120 is more than the number of output bits in the digital value.

For example, in one non-redundant architecture, each stage 120 effectively converts 1 bit and the residue amplifier gain G is 2. Therefore, eight stages 120 are required to implement an 8-bit A/D conversion. The eight raw bits $d_i$ are the actual output bits in the digital representation of the analog value, with the raw bit from stage 1 being the most significant output bit. As an example of a sub-radix architecture, each stage 120 might generate 1 raw bit but convert only 0.8 output bits with a residue amplifier gain G of $2^{0.8}$. More stages 120 are required, 10 stages in this case to implement an 8-bit A/D conversion. The 10 raw bits $d_i$ from the stages 120 are not the 8 output bits in the digital representation but are used to generate the final 8 bits using known algorithms. The sub-radix architecture allows gains errors to be tolerated by an amount proportional to the amount of gain reduction. It also allows redundancy with not much additional hardware.

A popular redundancy technique is a 1.5 output bits/stage architecture. In this technique, each stage 120 outputs 2 raw bits (thereby requiring additional comparators, which dissipate additional power), and backend processing uses this redundant information to improve accuracy. Using this technique, the accuracy of the ADC pipeline is set primarily by the accuracy of the interstage gain G. Because the gain of open-loop interstage amplifiers 125 is not as well controlled, this technique is not preferred for the present application. A sub-radix architecture, on the other hand, maintains 1 output bit per stage but provides redundancy by interstage gains of less than 2, and the accuracy of the interstage gain G is not as central to the architecture. This requires additional stages 120 (for example, an 8-bit ADC pipeline might require 10 or 11 stages using this technique) but only 1 comparator per stage. Again, backend processing uses the redundant information to provide the required accuracy.

Figure 2:
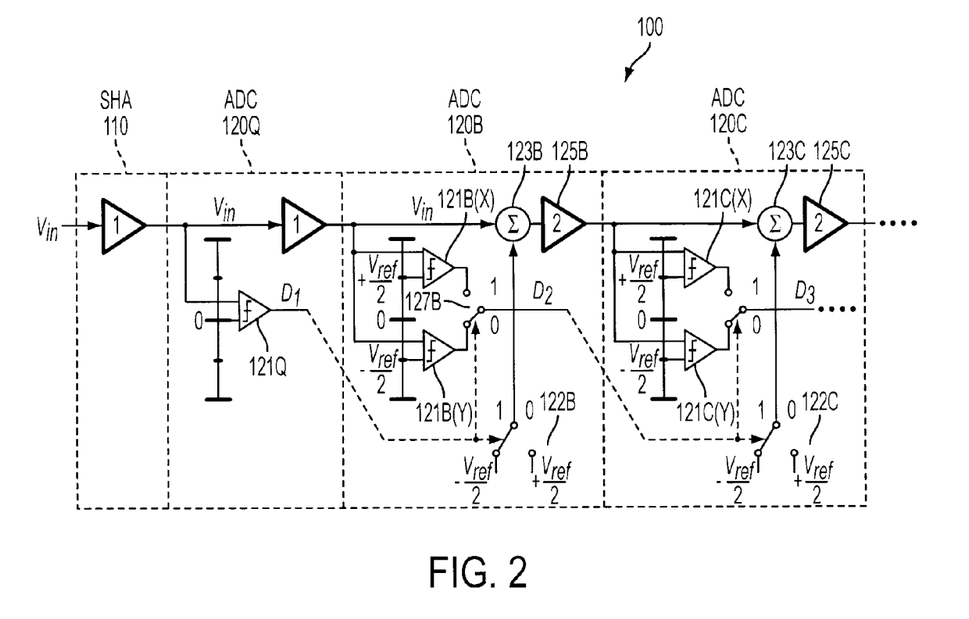
FIG. 2 is a block diagram of a lookahead ADC pipeline with open-loop residue amplifiers, according to the invention.

FIG. 2 is a block diagram of an ADC pipeline with lookahead capability. In a conventional ADC pipeline, the high speed comparator 121 regenerates between clock phases. This allows the comparator output time for positive feedback to drive the output to the desired value. Because of the relatively slower closed-loop interstage amplifiers, the clock period is set long enough that the comparator 121 has plenty of time to regenerate. However, with faster open-loop interstage amplifiers 125 and the resulting shorter clock periods, the comparator 121 may not have enough time to completely regenerate. One solution is to use a lookahead pipeline.

In the lookahead pipeline, the critical timing path, consisting of the amplifier settling time plus the comparator regeneration time, is broken into two shorter paths. In the example shown, all stages 120 (other than the first stage 120Q) have a pair of comparators 121(X) and 121(Y) (rather than a single comparator) that operates to develop the possible values for the stage based on the input value to the previous stage. This basically allows the interstage amplification and the comparator operation to occur in parallel, giving the comparators an entire clock half-period to regenerate. In this architecture, the first stage 120Q (that generates raw bit $D_1$) is a "half-stage" that uses a single comparator. The remaining stages 120B-N use two comparators 121 per stage. The last stage may be simplified since there is no following stage. The last stage could contain only the circuitry required to generate the last raw bit $D_N$ (e.g., eliminating the subtractor 123N and open-loop amplifier 125N). The architecture is somewhat more complex that an ADC pipeline without lookahead, but it allows much higher speeds when the interstage amplifier's speed is comparable to the comparator's speed.

In some sense, the sub-ADC 121 operation for a lookahead stage is moved ahead one stage. Referring to FIG. 2, stage 120B determines bit $D_2$. However, the input value to stage 120B is the original $V_{in}$. It is not the residue of $V_{in}$ after the contribution due to bit $D_1$ has been removed, as would be the case in an ADC pipeline without lookahead. In fact, the output of stage 120B (rather than the input) is the residue after the $D_1$ contribution has been removed. This one-stage shift is what allows the interstage amplification and the comparator operation to occur in parallel.

However, the sub-ADC 121 for stages 120B-N becomes more complex. The sub-ADC 121B for the second lookahead stage 120B includes two comparators 121B(X) and 121B(Y). These comparators determine the bit $D_2$ for stage 120B. Comparator 121B(X) determines bit $D_2$ assuming that bit $D_1$ is a 1. Comparator 121B(Y) determines bit $D_2$ assuming that bit $D_1$ is a 0. Switch 127B determines which result to select, depending on the output of sub-ADC 121Q of the previous stage 120Q. The bit $D_2$ is fed to the sub-DAC 122C of stage 120C.

As described above, the lookahead pipeline architecture allows (approximately) a full clock half period for the comparators to regenerate. There is also the potential to use part of the amplifier settling time for comparator regeneration, since the amplifier output will be approaching its final value closely enough that the comparator threshold has been passed and the comparator can begin regenerating.

Figure 3:
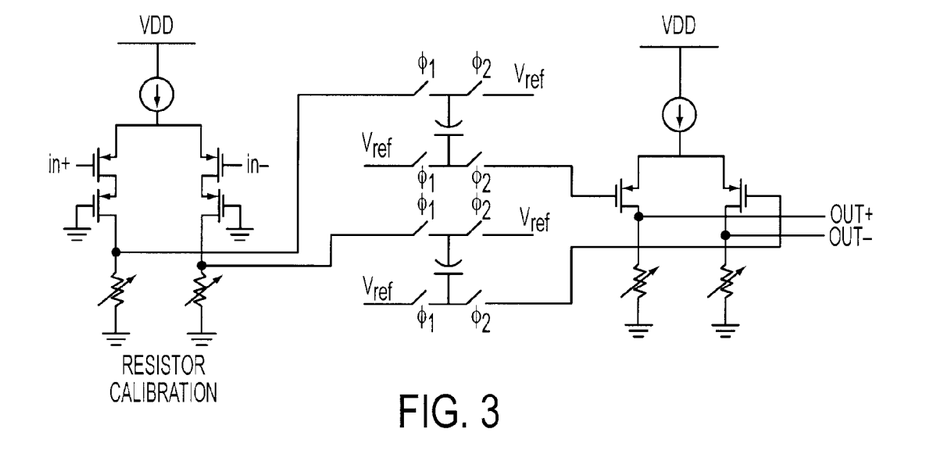
FIG. 3 is a circuit diagram of a residue amplifier and a sample-and-hold circuit.

FIG. 3 is a circuit diagram of one implementation of the sample-and-hold circuit 110. (Note that $V_{ref}$ in FIG. 3 is a different reference voltage than $V_{ref}$ in FIG. 2. For a common mode voltage of 0 as in FIG. 2, $V_{ref}$ in FIG. 3 would be set to 0.) The open loop configuration shown in FIG. 3 trades stable gain and higher linearity for a higher bandwidth at a given power consumption. The overall bandwidth of the amplifier in a closed-loop configuration is divided by $1/\beta$, where $\beta$ is the feedback factor. Therefore for a gain of approximately 2, the amplifier in a closed-loop configuration could require significantly more power than the open-loop configuration. Furthermore, the short channel effect in the 90 nm devices (in this example) allows a relatively high linearity for open-loop amplifiers where the differential pair input is submitted to the full scale amplitude of the signal. A total harmonic distortion of 45 dB has been obtained for input signal amplitude of 250 $mV_{pp-diff}$.

Figure 4:
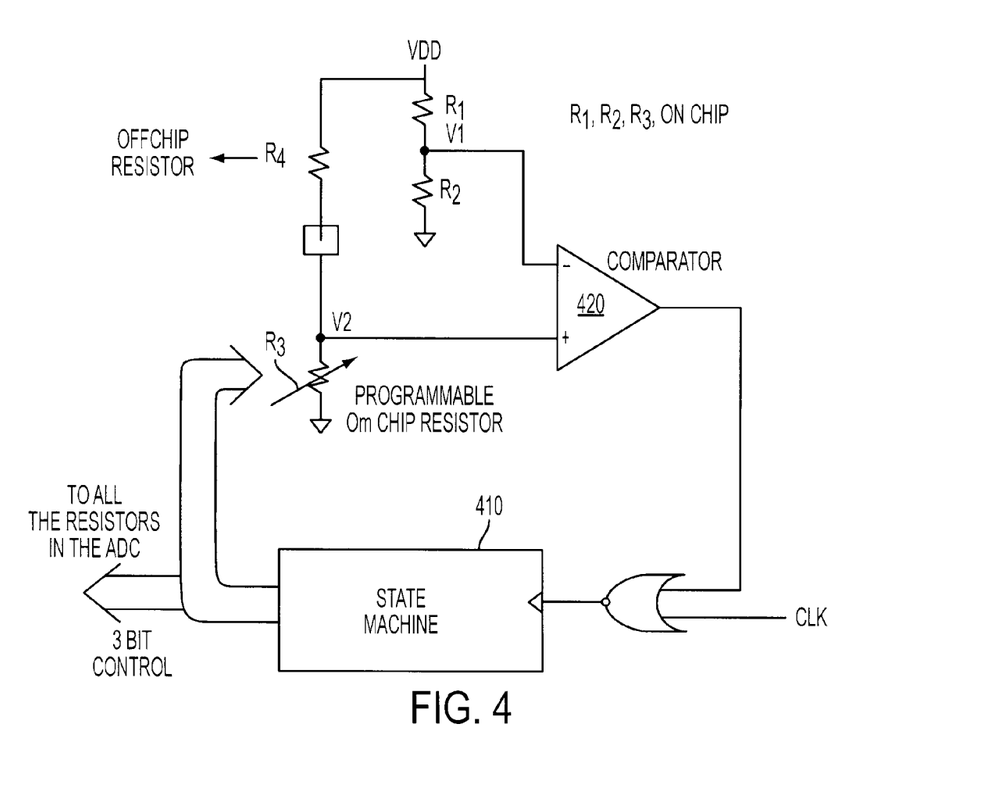
FIG. 4 is a circuit diagram of a resistor trimming circuit.

To alleviate gain variations due to process and temperature variations, a resistor trimming circuit controls the resistor absolute value accuracy to within±3%. FIG. 4 is a circuit diagram of an example resistor trimming circuit. Resistors R1 and R2 form a voltage divider, as do resistors R3 and R4. Resistors R1, R2 and R3 are on-chip and their resistances may vary, for example as a result of process variations. Resistor R4 has a well-controlled resistance value, for example it may be an off-chip resistor manufactured to tight tolerance that is electrically connected to the rest of the circuit via electrical ports (e.g., pads or pins) on the chip. Even though the absolute value of resistors of R1 and R2 may vary, their ratio will be fairly constant. Thus, the voltage V1 will not vary much as a function of process variations. State machine 410 varies the resistance of (digitally) programmable on-chip resistor R3 until voltage V2 matches V1, as determined by comparator 420. At that point, the state machine 410 remembers the correct digital code for resistor R3 and trims the other on-chip resistors accordingly. Resistor R4 and the ratio R1/R2 are chosen so that resistor R3 has the desired resistance when this happens.

In the example circuit, three bits are used to control the resistor R3. The state machine 410 counts through the three bits. At some point in the count, the comparator 420 output will flip. The state machine 410 is triggered by this and remembers the 3-bit sequence for correctly trimming resistor R3. If the other on-chip resistors are the same as R3 and intended to be set to the same resistance, the state machine 410 outputs the 3-bit sequence to the other on-chip resistors.

Figure 5A:
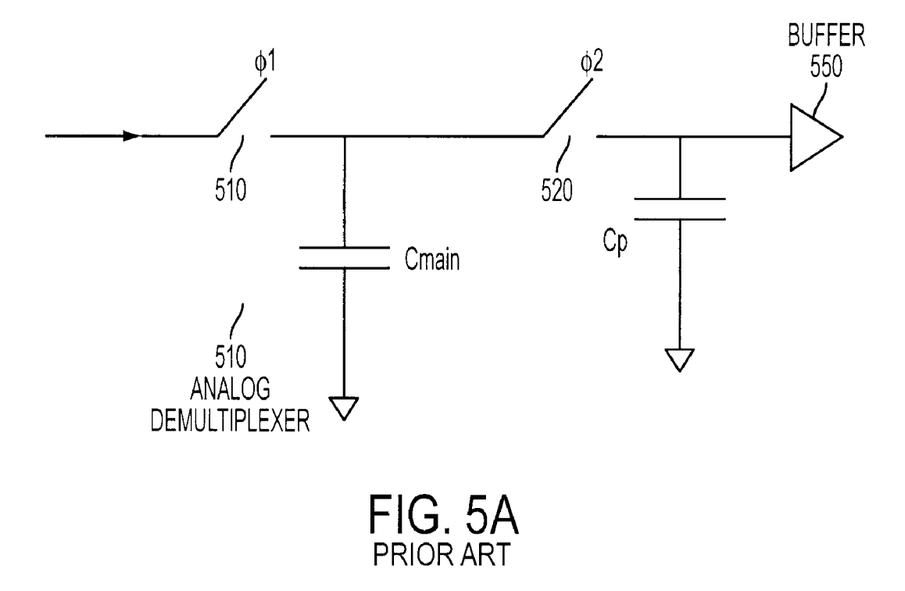
FIG. 5A (prior art) is a circuit diagram illustrating charge sharing.
Figure 5B:
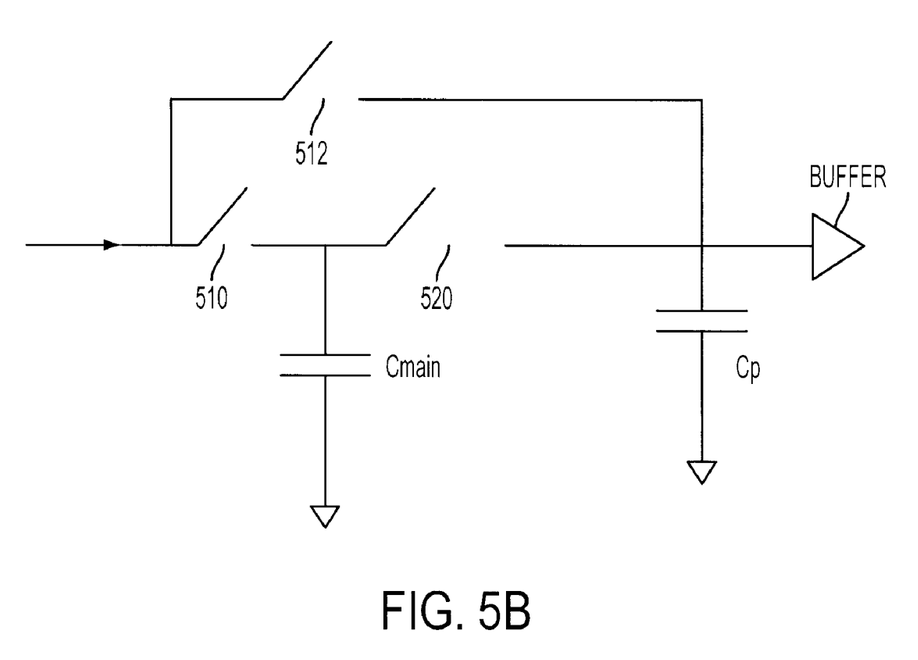
FIG. 5B is a circuit diagram of a circuit to reduce charge sharing.

FIGS. 5A (prior art) and 5B are circuit diagram illustrating a charge sharing reduction circuit for use with a sample-andhold circuit 110. In FIG. 5A, on clock phase φ1, switch 510 closes, switch 520 opens and the main capacitor $C_{main}$ is charged. On clock phase φ2, switch 510 opens, switch 520 closes and the charge on main capacitor $C_{main}$ drives buffer 550. The circuit shown in FIG. 3 uses a similar approach, but is a differential circuit. However, the buffer 550 has a parasitic capacitance $C_p$. On clock phase φ2, the charge on the main capacitor $C_{main}$ is shared with the parasitic capacitor $C_p$, thus lowering the overall voltage. In this particular example, the ADC is operating at high speed so $C_{main}$ preferably has a low capacitance. However, this increases the effect of charge sharing.

FIG. 5B is a circuit diagram of a circuit that reduces this effect. In effect, the parasitic capacitor $C_p$ is "pre-charged" while the main capacitor $C_{main}$ is charging. Thus, less charge is transferred between the two capacitors to equalize their voltage levels. On clock phase φ1, switches 510 and 512 close and switch 520 opens. Both the main capacitor $C_{main}$ and the parasitic capacitor $C_p$ are charged. On clock phase φ2, switches 510 and 512 open and switch 520 closes. The charge on main capacitor $C_{main}$ drives buffer 550. Charge sharing between the two capacitors $C_p$ and $C_{main}$ is reduced because they have both been previously charged to approximately the same level. In the example circuit, this reduction in charge sharing can increase the gain bandwidth product by 10-20%.

Referring back to FIGS. 1 and 2, FIG. 6 is a circuit diagram of a input pre-amplifier for comparator 121. The comparator input pre-amplifier is regenerative to provide high gain (e.g., >100) within a small fraction of the ADC clock cycle. In this example, it includes a PMOS fully differential input pair 610 and a regenerative NMOS pair 620 to obtain a low time constant. The remaining regeneration is performed by cascading a latch 630 after the pre-amplifier stage. Because of the high number of comparators used in each ADC channel, the device sizes preferably are scaled down to reduce power consumption, for example resulting in <1 mW power dissipation per comparator in this example.

Figure 6:
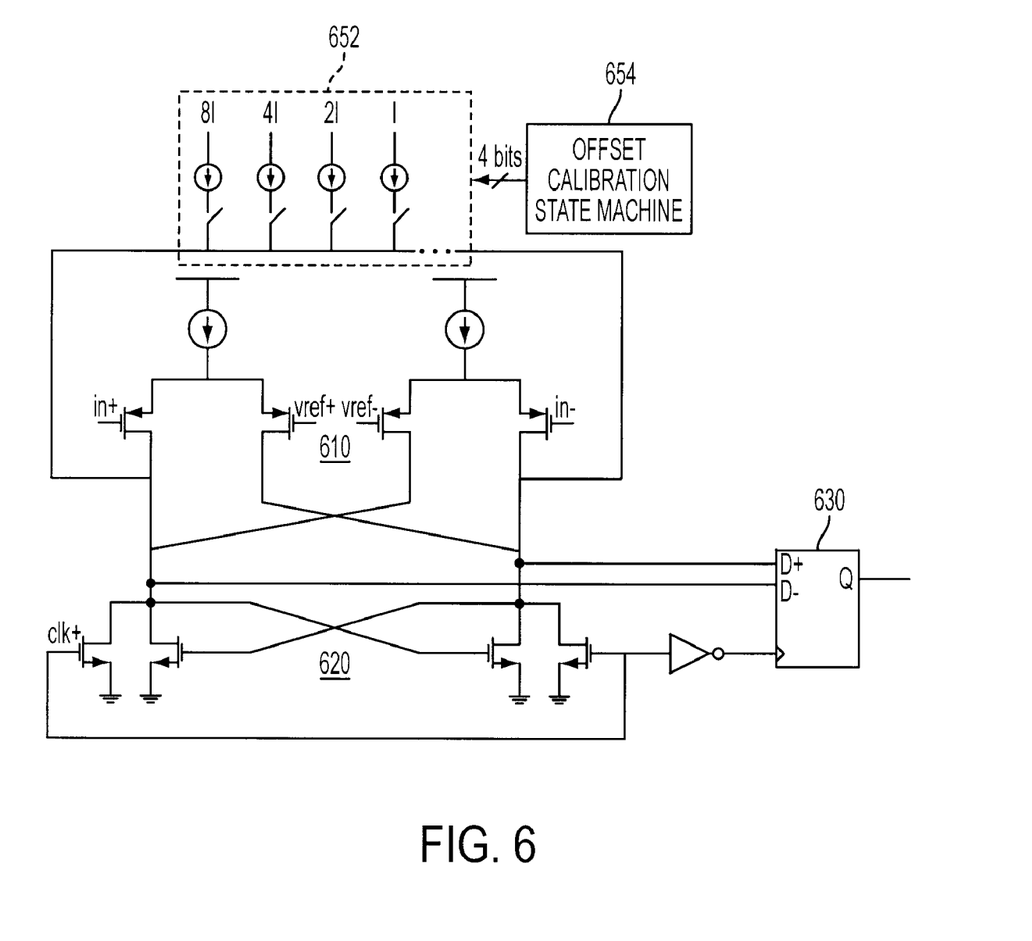
FIG. 6 is a circuit diagram of a comparator input pre-amplifier.

The resulting increase in input referred offset is corrected by an offset trimming circuit for each comparator. This circuit consists of a 4 bit DAC 652 controlled by a state machine 654. During the trimming phase, the inputs of the comparator are shorted. The state machine 654 sweeps the DAC 652 through the digital codes adding additional offset until the nominal offset of the comparator is cancelled. This limits the input referred offset of each comparator to ±2 mV in this particular design.

The comparators run at high speeds and make a comparison decision on every clock cycle. The decision can be broken into two periods: a settling period during which the input to the comparator is allowed to settle and a decision period during which the comparator makes the decision. If the settling period is too short, bad decisions will be made because the comparator is deciding based on unsettled data. If the decision period is too short, bad decisions will be made because the comparator does not have enough time to make a decision. Thus, a decision need be made regarding how much of each clock cycle is allocated to the settling period versus the decision period. If the settling period is defined as one clock level (e.g., clock high) and the decision period as the other clock level (e.g., clock low), then the allocation decision is equivalent to deciding the duty cycle of the clock signal.

Figure 7:
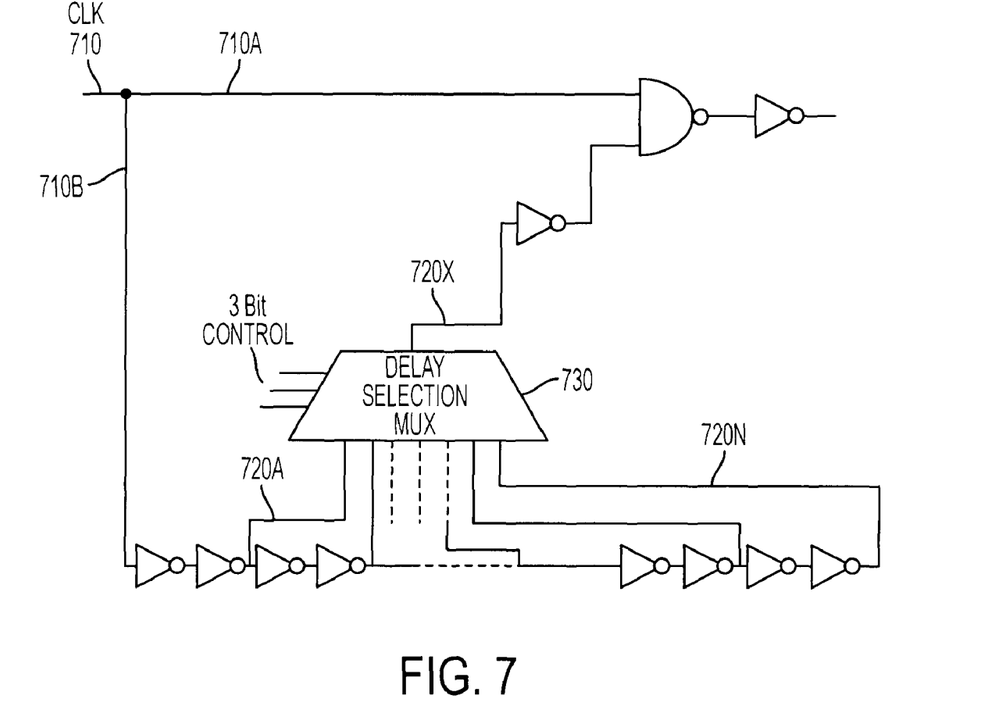
FIG. 7 is a circuit diagram of a circuit for adjusting the duty cycle of a clock signal.

FIG. 7 is a circuit diagram of a circuit for adjusting the duty cycle of a clock signal. The incoming clock signal 710 is split into two clock signals 710A and 710B. One clock signal 710B propagates through a series of delay circuits (implemented in this example as pairs of inverters). This creates multiple versions 720A-N of the clock signal, each delayed by a different amount related to version 710A. One of the delayed versions 720X is selected by multiplexer 730 and combined with 710A. The result is a clock signal with a variable duty cycle. The duty cycle is determined by which delayed version 720A-N is selected. The resulting clock signal is used to clock the comparator according to FIG. 6.

Figure 8:
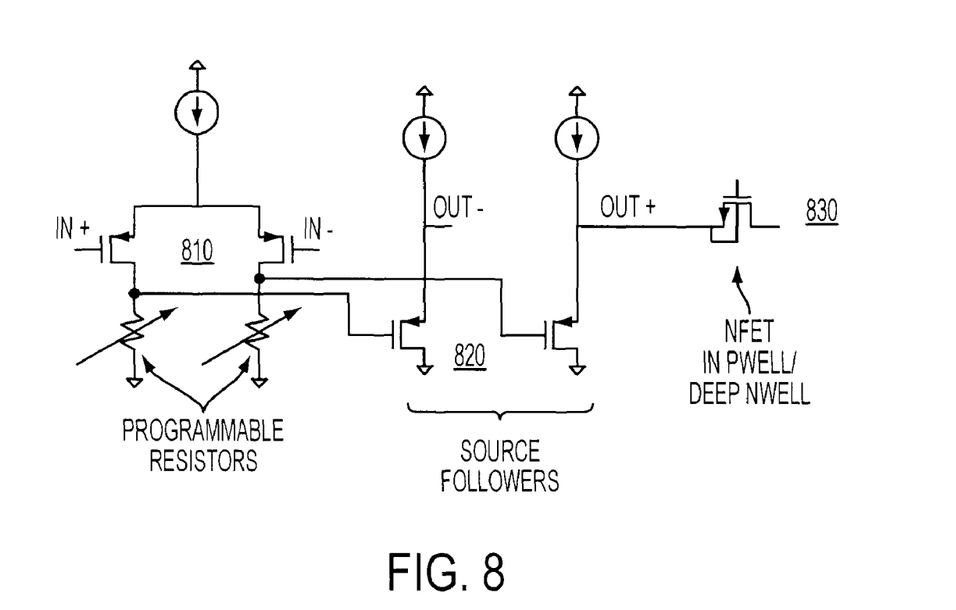
FIG. 8 is a circuit diagram of an open-loop amplifier.

FIG. 8 is a circuit diagram of an open-loop residue amplifier 125. This particular design adds a source follower 820 to a resistively loaded differential amplifier 810. The amplifier 810 uses programmable resistors that can be trimmed using the approach described in FIG. 4. The source followers 820 improve the gain bandwidth product in a power efficient manner. The output of the source followers 820 drives NFET switches 830 in a deep N well.

Consider again stage 120C in FIG. 2. In one implementation, the open-loop residue amplifier 125B is implemented by the source follower architecture shown in FIG. 8. The inputs to amplifier 125B are IN+ and IN− in FIG. 8, and the outputs of amplifier 125B are OUT+ and OUT− in FIG. 8. The output drives the comparators 121C(X) and 121C(Y) as well as the subtractor 123C. The comparators 121C are implemented as shown in FIG. 6. The inputs to the comparators 121C are in+ and in− in FIG. 6, and the output is Q in FIG. 6. The subtractor 123C is based on the capacitor structure of FIG. 3. On one clock phase, the capacitors are charged according to the output of amplifier 125B. The reference voltage $V_{ref}$ on the left side of the capacitor structure is set to the common mode voltage of the differential signal: 0 in this example. On the other clock phase, the capacitors are discharged according to the output of comparator 121B(X) or 121B(Y), as applicable, meaning that the reference voltage $V_{ref}$ on the right side of the capacitor structure is set to the common mode voltage plus or minus $V_{ref}/2$ (from FIG. 2) according to the output of the comparator 121B(X) or 121B(Y), as applicable.

Using stage 120C as an example, on clock phase φ1, the capacitors are charged by the output of amplifier 125B (FIG. 8 in this example). This amplifier output also drives the input of comparators 121C(X) and 121C(Y) (FIG. 6 in this example). These comparators are clocked by clk+, which can start before φ1 ends. The latch starts to latch around the beginning of clock phase φ2 and is ready to output by the end of clock phase φ2. The output of the selected latch 121C then drives the subtractor 123D of the next stage 120D during clock phase φ1. Note that the stages alternate clocking. Subtractor 123C is driven by latch 121B during clock phase φ2, subtractor 123D is driven by latch 121C during clock phase φ1, and so forth.

Figure 9:
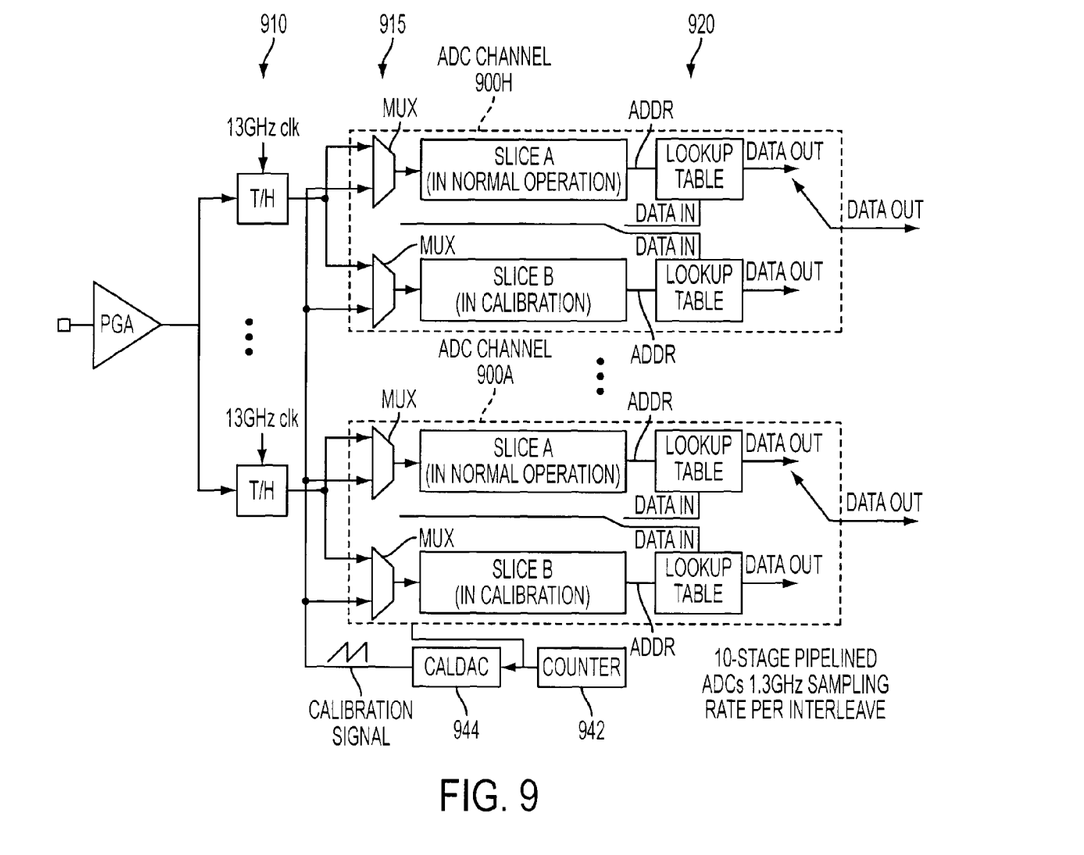
FIG. 9 is a block diagram of an interleaved ADC using parallel ADC channels.

FIG. 9 is a block diagram of an interleaved ADC based on the approaches described above. In this design, the ADC includes eight parallel time-interleaved ADC channels 900A-H. The eight channels 900A-H are time interleaved by analog demultiplexer 910 on the input side and a digital multiplexer (not shown) on the output side. Each ADC channel 900 operates at a nominal conversion rate of 1.25 GS/s (actual conversion rate 1.29 GS/s). Each ADC channel 900 includes two ADC lookahead pipelines 910 (labelled as slice A and slice B) of 11 stages each, with one pipeline in service at any one time and the other available for calibration. Each of the 16 lookahead pipelines 910 uses open-loop interstage amplifiers and subranging lookahead pipeline architecture. Lookup table calibration compensates for non-linearities. There are 16 lookup tables 920 for the non-linear calibration, one for each of the 16 pipelines 910. Each lookup table 920 takes the 11-bit raw input from the lookahead pipeline 910 as input and outputs the corrected 8-bit digital value.

Allowing for the expected worst case offset values and interstage gain tolerance (for the open-loop amplifiers), computing the required redundancy gives an ADC pipeline 910 with 11 stages and an interstage nominal gain G of 1.75. The 3 sigma input referred offset including comparators and residue amplifiers is estimated at 26 mV. This results in an interstage gain G of less than 1.82. With gain G=1.75, 11 stages are required to achieve 8 bit performance with 10% tolerance on the gain G.

The use of parallel (interleaved) ADC channels 900 can cause problems due to different gain and offset characteristics of the converters. The calculated tolerances for 8-bit performance include an offset mismatch<0.62 LSB=0.73 mV and gain mismatch<0.34%. However, these mismatches are largely compensated for by the lookup table. Similarly, the parallel ADC channels 900 may have sampling time mismatch. The calculated tolerance is timing mismatch<4 ps (static skew). Conventional techniques are used to address timing mismatch.

As shown in FIG. 9, a lookup table approach is used to compensate for amplifier non-linearity. An ADC pipeline 910 typically requires fairly linear residue amplifiers 125 if the result is to be used without additional correction. One drawback of using open-loop amplifiers 125 is they can be non-linear. Different approaches can be used to compensate for effects caused by the non-linearity of open-loop amplifiers 125. The overall ADC pipeline unit includes an ADC pipeline 910 followed by a calibration unit, which in this example is a lookup table 920. As a result of the non-linearities of the individual stages 120 in the pipeline 910, the response of the overall ADC pipeline 910 has a complex non-linear characteristic. Denote this by a function f(vin). In other words, the raw bits $d_1$ generated by the pipeline stages do not map in a linear manner to the output bits in the final digital representation. In FIG. 9, the "distorted" raw bits $d_i$ from the ADC pipeline 900 are applied as an address into a lookup table 920 which stores the inverse of the non-linear characteristic. Thus, the LUT 920 reverses the effects of the non-linear open-loop amplifiers, and the output of the LUT 920 is used as the digital output of the ADC.

In the example of FIG. 9, the LUTs 920 are continuously calibrated to generate the non-linear mapping stored in LUT 920. A counter 942 and calibration DAC 944 generate a known voltage ramp. This is applied (by multiplexers 915) to the input of the ADC pipelines 900 under calibration (the other ADC pipeline in each pair is under normal operation). The resulting raw bits $d_i$ are observed. In this particular example, the calibration unit 942/944 generates a slow but accurate ramp. Since the ramp can be relatively slow, a digital ramp (e.g., from the system DSP) can be applied to a digital to analog converter (DAC) 944 that has the required accuracy. The known ramp values are applied to the ADC pipeline 900, and the resulting raw bits $d_i$ are used as an address in the lookup table 920 that contains the known ramp value (i.e., the actual output bits corresponding to vin). In this way, all possible values of vin are represented in the table 920 by the raw bits $d_i$ corresponding to that value of vin.

The lookup tables 920 are updated using an LMS algorithm, where the error is computed as the difference between the current content of the lookup table entry addressed by the pipeline output and the expected output, which is the output of the counter 942. If the two quantities are identical, the lookup table 920 entry is already correct and it does not need to be updated. Correspondingly, the error is zero, so that no update takes place. However, if the two quantities differ, there will be an update. The LMS algorithm effectively averages many updates, so that the entries in the lookup table 920 are not computed based on a single conversion, but on an average of many conversions.

Figure 10:
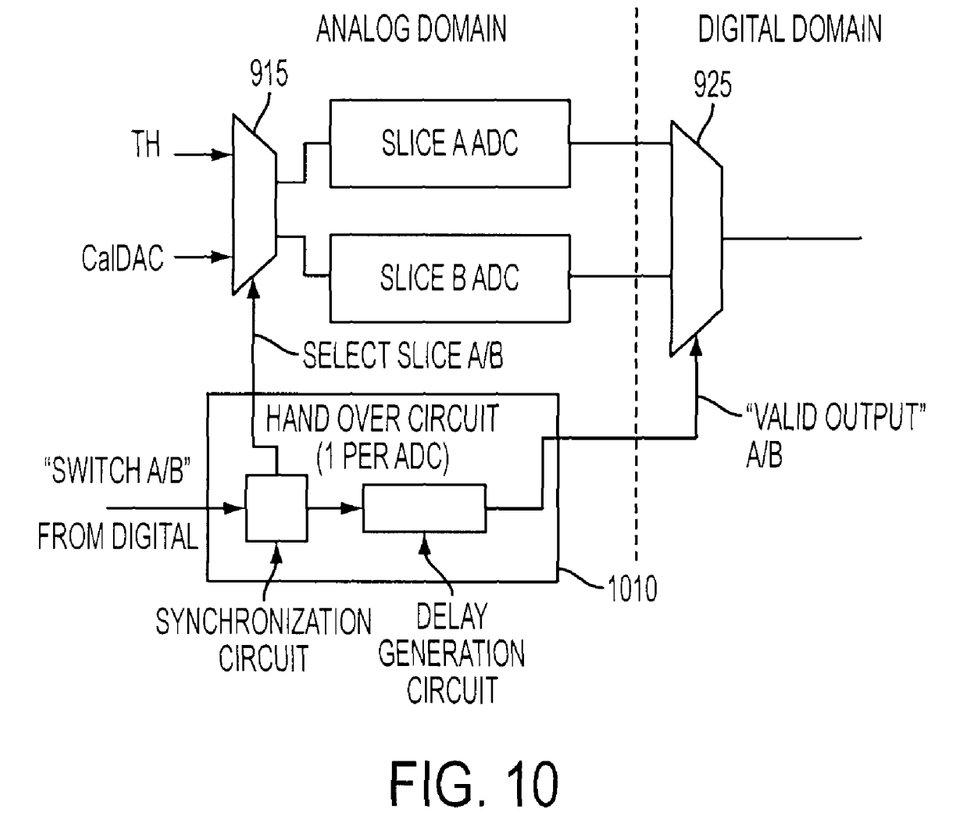
FIG. 10 is a block diagram of a circuit that switches between calibration and normal operation for ADC pipeline units.

Each interleaved ADC channel 900 includes two pipeline units which are constantly being swapped between normal operation and calibration modes, at a rate of about 1 MHz. At any given instant, one of the two pipelined units is in normal operation, while the other is in calibration. Approximately every microsecond, the units are automatically interchanged. FIG. 10 is a block diagram of a circuit that achieves this. In one approach, the circuit 1010 is a state machine. Multiplexers 915 determines whether live signal or calibration signal is input to each ADC pipeline unit (denoted as slice A and slice B in FIG. 10). Multiplexer 925 determines which ADC pipeline unit is used as output for live data. Circuit 1010 synchronizes these multiplexers.

For example, assume that slice A is live and slice B is in calibration. When circuit 1010 receives a "switch A/B" signal, it switches the settings for multiplexers 915 so that live signal now goes to slice B and slice A receives calibration signal. Circuit 1010 will also switch multiplexer 925 so that live data is now received from slice B instead of slice A, but there is a delay because pipeline unit A must first empty its live data before the switch can occur at the output. To an external observer, the pair of pipelined units operates as a single high-precision ADC channel 900.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents. Furthermore, no element, component or method step is intended to be dedicated to the public regardless of whether the element, component or method step is explicitly recited in the claims.

In the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims.

What is claimed is:

1. An ADC pipeline unit for converting input analog values to N-bit digital representations, the ADC pipeline unit implemented as a single integrated circuit and comprising:

M lookahead pipeline stages, each lookahead pipeline stage generating 1 raw bit for a total of M raw bits, with M>N, the stages including open-loop residue amplifiers, the M lookahead pipeline stages comprising an input sample-and-hold stage for receiving the input analog value, the input sample-and-hold stage including:

an input node;

a main capacitor coupled between a first node and ground;

a buffer having an input;

a first switch(es) coupled between the input node and the main capacitor, and between the input node and the input to the buffer; and a second switch coupled between the first node and the input to the buffer;

the first switch(es) closed and the second switch open during a sample phase and the first switch(es) open and the second switch closed during a hold phase; and a calibration unit coupled to the lookahead pipeline stages to compensate for non-linearity in the open-loop residue amplifiers.

2. The ADC pipeline unit of claim 1 wherein the M lookahead pipeline stages further comprise:
   a first lookahead pipeline half-stage coupled to the input sample-and-hold, for producing a first raw bit; and
   M-1 lookahead pipeline stages coupled in series to the first lookahead pipeline half-stage, each lookahead pipeline stage producing an additional raw bit;
   wherein each of the half-stage and the first M-2 stages includes an open-loop residue amplifier.

3. The ADC pipeline unit of claim 2 wherein:
   the first lookahead pipeline half-stage includes a single comparator for determining the first raw bit; and
   each of the M-1 lookahead pipeline stages includes two comparators, one comparator for determining the raw bit for the stage assuming that the raw bit from a previous stage was 0 and another comparator for determining the raw bit for the stage assuming that the raw bit from the previous stage was 1.

4. The ADC pipeline unit of claim 1 wherein the lookahead pipeline stages can operate at a conversion rate of 1.25 GS/s or higher at an effective resolution of at least 5 bits per sample.

5. The ADC pipeline unit of claim 1 wherein the lookahead pipeline stages can operate at a quantization energy of 0.3 pJ/conv-step or less.

6. The ADC pipeline unit of claim 1 wherein $N \geq 8$.

7. The ADC pipeline unit of claim 1 wherein $N \geq 5$.

8. An ADC pipeline unit for converting input analog values to N-bit digital representations, the ADC pipeline unit implemented as a single integrated circuit and comprising:
   M lookahead pipeline stages, each lookahead pipeline stage generating 1 raw bit for a total of M raw bits, with M>N, the stages including open-loop residue amplifiers;
   a calibration unit coupled to the lookahead pipeline stages to compensate for non-linearity in the open-loop residue amplifiers; and
   a circuit for adjusting a duty cycle of a clock signal, wherein the lookahead pipeline stages include comparators that generate the 1 raw bit for the stages, the comparators clocked by the clock signal, the duty cycle of the clock signal determining a settling period and a decision period for the comparator.

9. The ADC pipeline unit of claim 8 wherein the circuit for adjusting a duty cycle of a clock signal comprises:
   an input node for receiving a clock signal;
   a series of delay circuits, a beginning of the series coupled to the input node, the series creating a plurality of delayed clock signals;
   a multiplexer coupled to the delay circuits to receive the plurality of delayed clock signals as inputs, the multiplexer selecting one of the delayed clock signals as an output; and
   a logic circuit coupled to the input node and to the output of the multiplexer, for combining the clock signal with the delayed clocked signal to produce a clock signal of adjustable duty cycle.

10. The ADC pipeline unit of claim 8 wherein the M lookahead pipeline stages comprise:
   an input sample-and-hold stage for receiving the input analog value;
   a first lookahead pipeline half-stage coupled to the input sample-and-hold, for producing a first raw bit; and
   M-1 lookahead pipeline stages coupled in series to the first lookahead pipeline half-stage, each lookahead pipeline stage producing an additional raw bit;
   wherein each of the half-stage and the first M-2 stages includes an open-loop residue amplifier.

11. The ADC pipeline unit of claim 10 wherein:
   the first lookahead pipeline half-stage includes a single comparator for determining the first raw bit; and
   each of the M-1 lookahead pipeline stages includes two comparators, one comparator for determining the raw bit for the stage assuming that the raw bit from a previous stage was 0 and another comparator for determining the raw bit for the stage assuming that the raw bit from the previous stage was 1.

12. The ADC pipeline unit of claim 8 wherein the lookahead pipeline stages can operate at a conversion rate of 1.25 GS/s or higher at an effective resolution of at least 5 bits per sample.

13. The ADC pipeline unit of claim 8 wherein the lookahead pipeline stages can operate at a quantization energy of 0.3 pJ/conv-step or less.

14. The ADC pipeline unit of claim 8 wherein $N \geq 8$.

15. The ADC pipeline unit of claim 8 wherein $N \geq 5$.

\* \* \* \* \*